US009570195B2

(12) United States Patent
Kashyap et al.

(10) Patent No.: US 9,570,195 B2
(45) Date of Patent: Feb. 14, 2017

(54) ON CHIP CHARACTERIZATION OF TIMING PARAMETERS FOR MEMORY PORTS

(71) Applicant: Texas Instruments Incorporated, Dallas, TX (US)

(72) Inventors: Abhijith Ramesh Kashyap, Bangalore (IN); Shrikrishna Pundoor, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 3 days.

(21) Appl. No.: 14/635,204

(22) Filed: Mar. 2, 2015

(65) Prior Publication Data

US 2015/0248925 A1 Sep. 3, 2015

(30) Foreign Application Priority Data

Feb. 28, 2014 (IN) .......................... 1018/CHE/2014

(51) Int. Cl.
*G11C 7/00* (2006.01)
*G11C 29/02* (2006.01)

(52) U.S. Cl.
CPC ........... *G11C 29/022* (2013.01); *G11C 29/023* (2013.01); *G11C 29/028* (2013.01)

(58) Field of Classification Search
USPC ..................................................... 365/189.02
See application file for complete search history.

(56) References Cited

U.S. PATENT DOCUMENTS

2003/0160980 A1* 8/2003 Olsson ...................... G03F 1/14 358/1.9
2005/0060600 A1* 3/2005 Jeddeloh ............. G06F 11/2221 714/5.11
2006/0143454 A1* 6/2006 Walmsley .............. G06F 21/85 713/170
2006/0187251 A1* 8/2006 Pulver ................. B41J 2/04505 347/13
2006/0294312 A1* 12/2006 Walmsley ............ H04L 9/0662 711/122
2011/0251819 A1* 10/2011 Ong ................. G01R 31/31928 702/120

* cited by examiner

*Primary Examiner* — Hoai V Ho
*Assistant Examiner* — Pablo Huerta
(74) *Attorney, Agent, or Firm* — Robert D. Marshall, Jr.; Frank D. Cimino

(57) ABSTRACT

A circuit and method for memory characterization. The circuit includes first and second programmable delay lines, address and data registers, an output register and a finite state machine controller. The finite state machine controller supplies an address to the address register, data to the data register and controlling a delay of the first programmable delay line and the second programmable delay line in at least one predetermined sequence to determine an operating characteristic of the memory to be tested. The programmable delay lines may be connected as a ring oscillator. Determination of the frequency of the ring oscillator via a counter determines the delay of the delay line. The programmable delay lines, the address register and data registers, the output register, the finite state machine controller and the memory to be tested are preferably constructed on a same semiconductor substrate.

19 Claims, 12 Drawing Sheets

200

Config Register
FSM
210
211
213
215
217
220
221
MEMORY
DL
Clock

ON CHIP CHARACTERIZATION OF TIMING PARAMETERS FOR MEMORY PORTS

CLAIM OF PRIORITY

This patent application claims priority under 35 U.S.C. 119(a) from Indian Provisional Patent Application No. 1018/CJE/2014 filed Feb. 28, 2012.

TECHNICAL FIELD OF THE INVENTION

The technical field of this invention is timing characterization for memory ports.

BACKGROUND OF THE INVENTION

Memory is a part of every CPU design and SoC. Integrated memories have timing requirements to be met just as any mega-module. These timing parameters are dictated by the address/data decoders, the bit cells and the latches; that vary with the type of memory.

These timing parameters include setup time and hold time on the input interface and the clk-to-output delay. These timing parameters have a significant bearing on the maximum achievable frequency of the design. Placement and routing tools rely on timing parameters given by liberty files. Thus the characterization and validation of these numbers are crucial. The spice characterization data has to be validated on silicon by actual measurement of these parameters. Memory testchips have test circuits meant for timing characterization.

The problem is to design a circuit to characterize these timing parameters for the memory:

1. Setup/Hold for Address bus;
2. Setup/Hold for Data bus;
3. Clk to Q delay.

The circuit should be self-contained requiring minimal user intervention and be capable of characterizing all bit-lines in the bus.

FIG. 1 illustrates a block diagram of a prior art characterization circuit 100. Characterization circuit 100 includes circuit under test 110, signal generator 120 and oscilliscope 130. Signal generator 120 generates test signals. These are applied to the inputs of memory 115 via multiplexers 111 and 113 in an appropriate sequence. Oscilloscope 130 receives outputs from memory 115 and the test signals from signal generator 120. Thus user of characterization circuit 100 observes the response of memory 115 on the display of oscilloscope 130.

In this prior art circuit, measurement was based on oscilloscope observations. Characterization circuit 110 required differential signaling and had tight constraints on the physical design. Characterization circuit 110 does not measure the parameters directly. The user must make measurements via oscilloscope 130 outside the circuit under test 100.

SUMMARY OF THE INVENTION

This invention is a circuit and method for memory characterization. The circuit includes first and second programmable delay lines, address and data registers, an output register and a finite state machine controller. The finite state machine controller supplies an address to the address register, data to the data register and controlling a delay of the first programmable delay line and the second programmable delay line in at least one predetermined sequence to determine an operating characteristic of the memory to be tested.

The programmable delay lines may be connected as a ring oscillator. The frequency of the ring oscillator determines via a counter the delay of the delay line.

The programmable delay lines, the address register and data registers, the output register, the finite state machine controller and the memory to be tested are preferably constructed on a same semiconductor substrate.

Each of the programmable delay lines includes a serial chain of a plurality of delay elements and a decoder receiving a delay code. The decoder activates a number of delay elements corresponding to the delay code.

A read mode characterization of the memory to be tested, includes: storing a predetermined data pattern in the memory to be tested at a first address; storing an inverse of the predetermined data pattern in the memory to be tested at a second address having one bit differing from the first address; and then for each of a plurality of delay values reading the memory to be tested at the first address delayed by a current delay value, capturing a read output of the memory to be tested, and determining whether the read output is the predetermined data pattern or the inverse.

A write mode characterization of the memory to be tested, includes: for each of a plurality of delay values storing all 0's in all memory locations of the memory to be tested; storing a predetermined data pattern at a predetermined address in the memory to be tested; reading from the memory to be tested at the predetermined address; and determining whether the read output is the predetermined data pattern.

A clock to output characterization of the memory to be tested, includes: storing a predetermined data pattern in the memory to be tested at a first address; storing the predetermined data pattern in the memory to be tested at a second address one more than the first address; for each of a plurality of delay values reading the memory to be tested at the first address delayed in the second delay line by a minimum delay value, reading the memory to be tested at the second address delayed in the second delay line by a current delay value, capturing a read output of the memory to be tested, and determining whether the read output is the predetermined data pattern.

BRIEF DESCRIPTION OF THE DRAWINGS

These and other aspects of this invention are illustrated in the drawings, in which.

DETAILED DESCRIPTION OF PREFERRED EMBODIMENTS

This invention provides complete on-silicon characterization of static random access memory (SRAM) memories. This may be used for testing all the Address and Data pins of the memory, with respect the clock pin for Setup-Hold timing and the clk-to-q delay. Given an address or data pin to be characterized, the circuit of this invention measures both the setup and hold time as a ratio with respect to the reference clock supplied.

Figure 1:
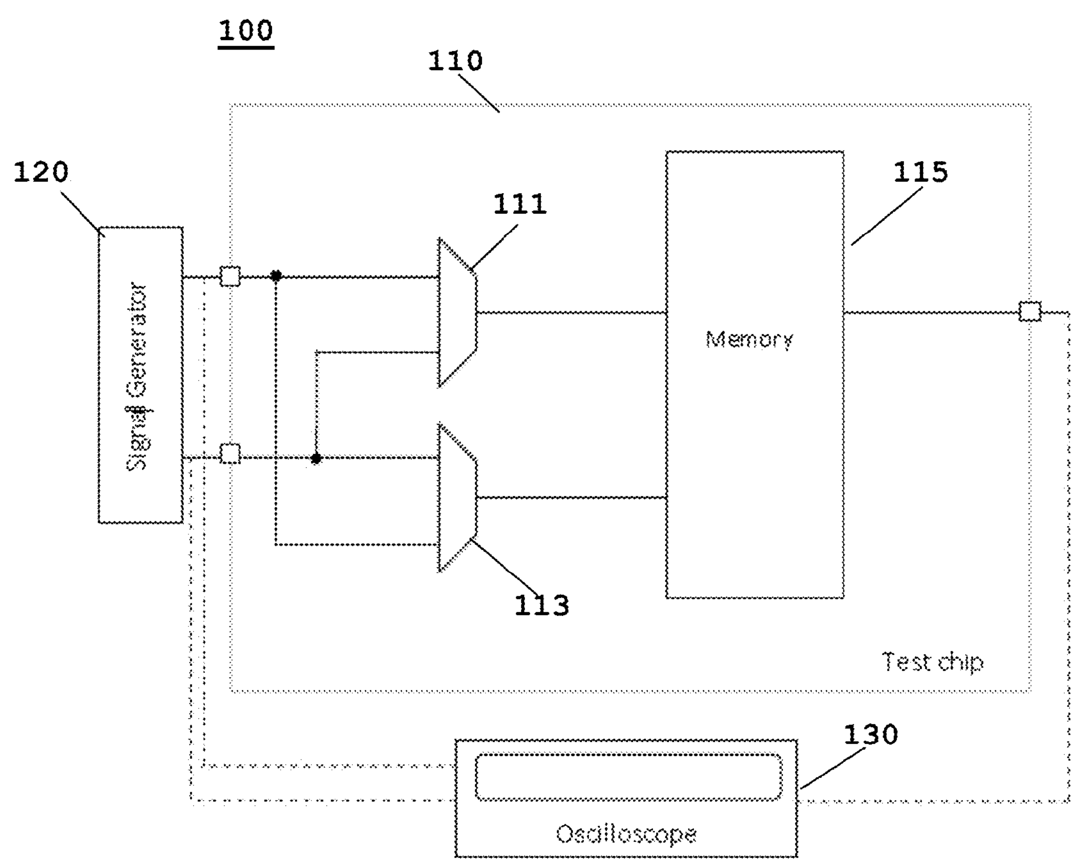
FIG. 1 illustrates a block diagram of a prior art characterization circuit.
Figure 2:
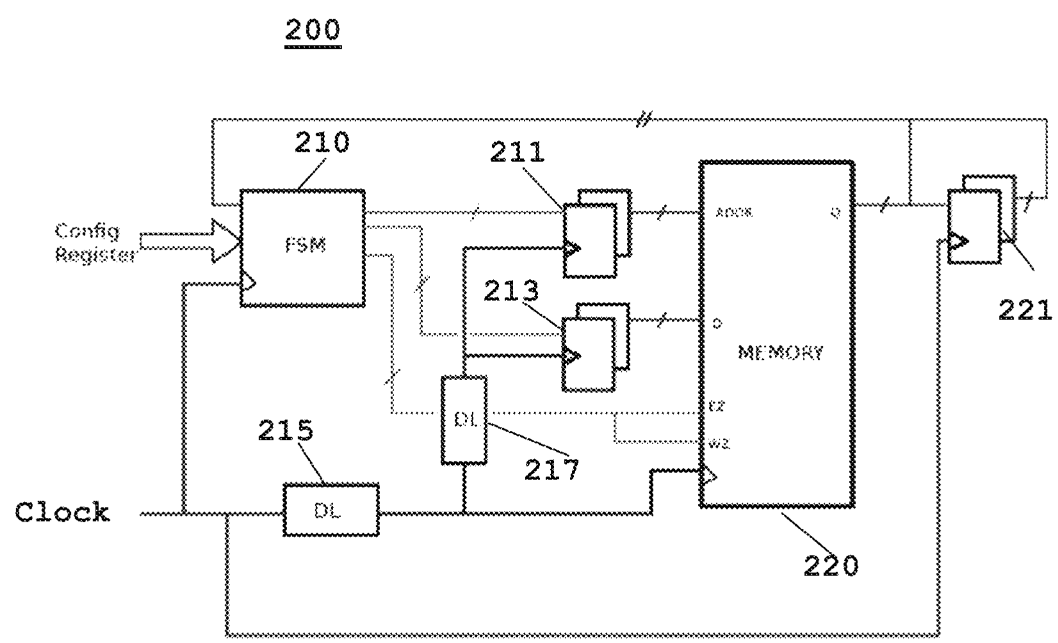
FIG. 2 illustrates a block diagram of characterization circuit of one embodiment of this invention.

FIG. 2 illustrates a block diagram of characterization circuit 200. Characterization circuit 200 includes: finite state machine (FSM) 210; address bit hold register 211; data hold register 213; first programmable delay line 215; second programmable delay line 217; memory under test 220; and output hold register 221. In the preferred embodiment the elements of characterization circuit 200 are disposed on the same semiconductor substrate as memory under test 220.

FSM 210 operates under control of bits from a control register (not illustrated). FSM 210, first programmable delay line 215 and output hold register 221 receive the clock directly. Memory under test 210 receives the clock delayed by first programmable delay line 215. Address bit hold register 211 and data hold register 213 receive the clock delayed by first programmable delay line 215 and second programmable delay line 217. FSM 210 supplies address bits to address bit hold register 211 and supplies data bits to data hold register 213. These bits are sensed and stored in the respective hold registers when clocked by the clock delayed by both first programmable delay line 215 and second programmable delay line 217. Output hold register 221 stores the output of memory under test 220 when clocked directly by the clock input. Appropriate control of the address and data bits output by FSM 210 and control of the delays of first programmable delay line 215 and second programmable delay line 217 permits comparison of expected outputs with the outputs of memory under test 220 to measure memory parameters.

Characterization circuit 200 controls the time at which the address and data bit lines change using a programmable delay line. Characterization circuit 200 controls the clock pins of address bit hold register 211 and data hold register 213, which will subsequently drive pins of memory under test 220. This introduces an intentional skew in the clock path of the launch path, while there is no delay in the clock network of the capture path. By varying the delay, the capture time can be moved into the setup-hold window. Controlling the delay on the clock path of memory under test 220 permits measurement of the clock to Q delay. The delay is controlled by a control block. This block also ensures that memory is initialized correctly, controls the time when the memory is enabled, and verifies the output of the memory.

The entire delay line is swept from code 0 to delay_max_code in increments of 1 step. At each delay step, multiple measurements are taken to reduce the effect of jitter/noise in the system. After sweeping the delay line, the delay line is characterized at those 2 particular delay line control codes where setup and hold boundaries were observed in a sequential manner. These characterized times are finally presented at the output pins, along with a done signal.

This invention includes these characterization Modes: RISE/FALL edge; read mode; write mode; and clock to Q measurement. To determine each bit line RISE/FALL edge, each of bit line is tested for a setup_rising-hold_rising combination or a setup_falling-hold_falling combination. The internal control logic ensures that the correct edge is presented on the bit line based on the "mem_test_rise" input to the block. This is controlled by the control bits stored in the configuration register.

The read mode is enabled by setting the input "mem_test_read" to 1. For memories, the data pins are don't-care when in read mode. These pins have no timing arcs to Q of memory and are not characterized in the read mode. Only address pins are characterized in the read mode. Based on setup_pass/hold_pass, the delay codes are stored in separate registers.

The basic read mode algorithm is as follows:

1. Initialize the address locations to user defined data_pattern with delay_code=0.

2. Initialize the next address location (changing only the bit to be tested) with inverted data pattern (~(data_pattern)).

3. Launch the address from address bit hold register 211 using the current delay_code causing a delayed clk from delay line 217.

4. Determine the output (Q) of memory 220. If Q is data_pattern, then setup is passing. If Q is the inverted data_pattern, then hold is passing. If Q is neither, then neither setup nor hold is passing.

5. Repeat from step 2, in this example 8 times.

6. Increment delay_code.

7. Repeat from step 2, until delay_code reaches the maximum delay code.

Figure 3:
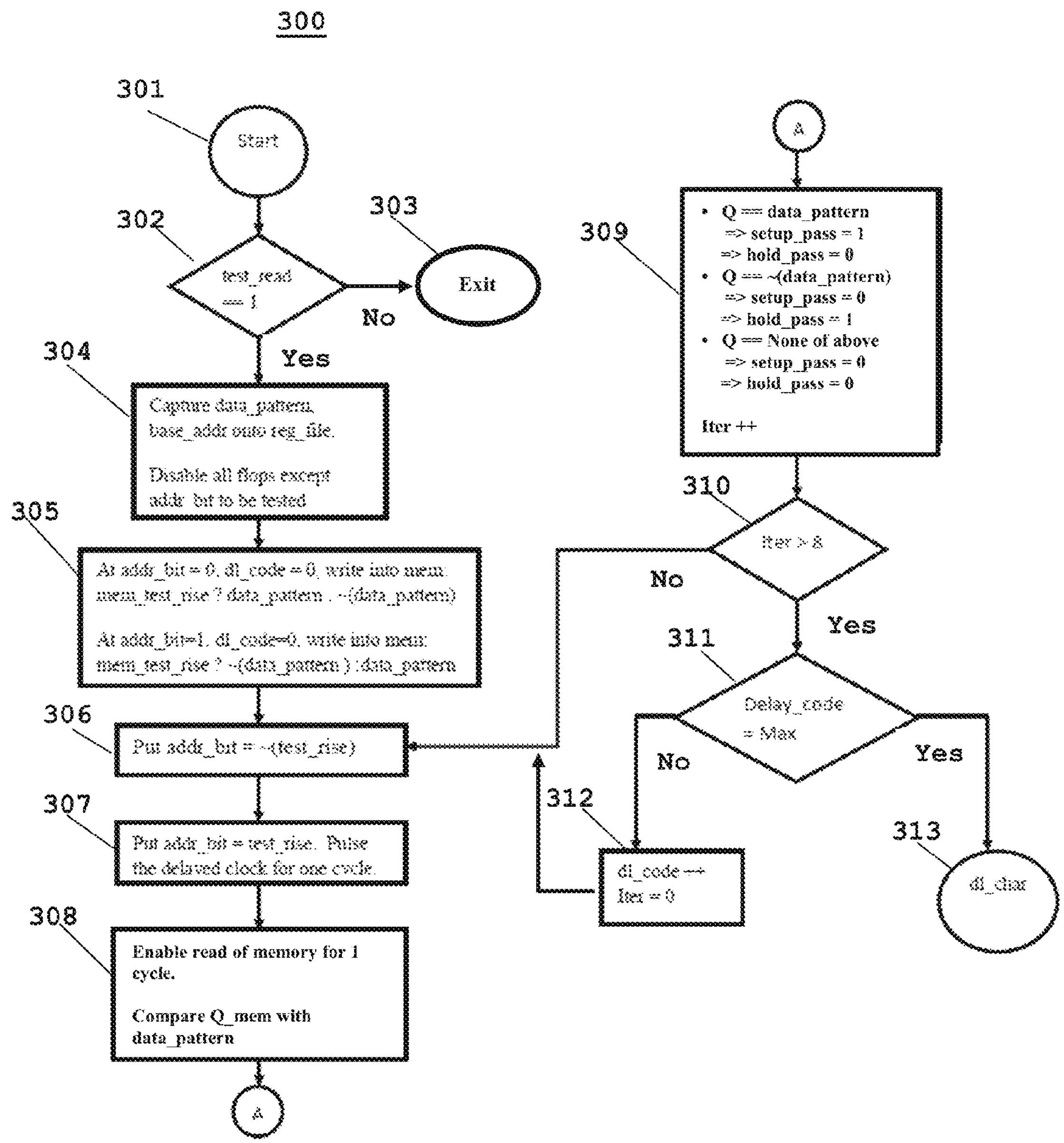
FIG. 3 is a flow chart illustrating the basic algorithm for read mode characterization of one embodiment of this invention.

FIG. 3 is a flow chart illustrating the basic algorithm 300 for read mode characterization. Algorithm 300 begins with start block 301. Test block 302 determines if the test_read is active (test_read==1). If not (No at test block 302), then algorithm 300 is inapplicable and ends at exit block 303. If true (Yes at test block 302), then algorithm 300 proceeds with block 304. Block 304 initializes the address locations to user defined data pattern, with delay_code=0; initializes the next address location changing only the bit to be tested with inverted data pattern. Block 304 captures the data_pattern at the base address onto the register file. Block 304 disables all flip-flops except for the address bit to be tested.

Block 305 performs at addr_bit=0, delay_code=0, write into memory mem_test_rise_data_pattern:~(data pattern). Block 305 also performs at addr_bit=1, delay_code=0, write into memory mem_test_rise~(data_pattern):data_pattern. Block 306 performs Put addr_bit=~(test_rise). Block 307 performs put addr_bit=test_rise and pulses the delayed clock for one cycle. Block 308 enables a memory read for one cycle, the compares the output Q_mem with data_pattern.

Block 309 sets some parameters based upon the comparison of block 308. If Q==data_pattern, then block 309 sets setup_pass=1 and hold_pass=0. This indicates that setup is passing. If Q==~(data_pattern) then block 309 sets setup_pass=0 and hold_pass=1. This indicates that hold is passing. If Q is neither of those, then block 309 sets setup_pass=0 and hold_pass=0. This indicates that neither setup nor hold is passing. Block 309 increments a loop variable iter (iter++).

Test block 310 determines if the loop variable iter is greater than 8. FIG. 3 illustrates an example that takes 8 measurements for each step of delay_code. This is merely an example, the number of iterations could be less than or more than 8. If iter is not greater than 8 (No at test block 310), then program flow proceeds to block 306 for another iteration. If iter is greater than 8 (Yes at test block 310), then repeat testing for the current value of delay_count is complete. Program flow proceeds to test block 311.

Test block 311 determines whether delay_code is the maximum delay_code. If delay_code does not equal the maximum delay_code (No at test block 311), then further delay_code steps are needed. Program flow proceeds to block 312. Block 312 increments delay_code (delay_code++). Block 312 resets the iteration variable iter (iter=0). Program flow returns to block 306 for testing at the next delay_code value. If delay_code does equal the maximum delay_code (Yes at test block 311), then no further delay_code steps are needed. Program flow proceeds to block 313 which captures the results (delay_char). This involves the stepup_pass and hold_pass variables set in block 309.

Figure 4:
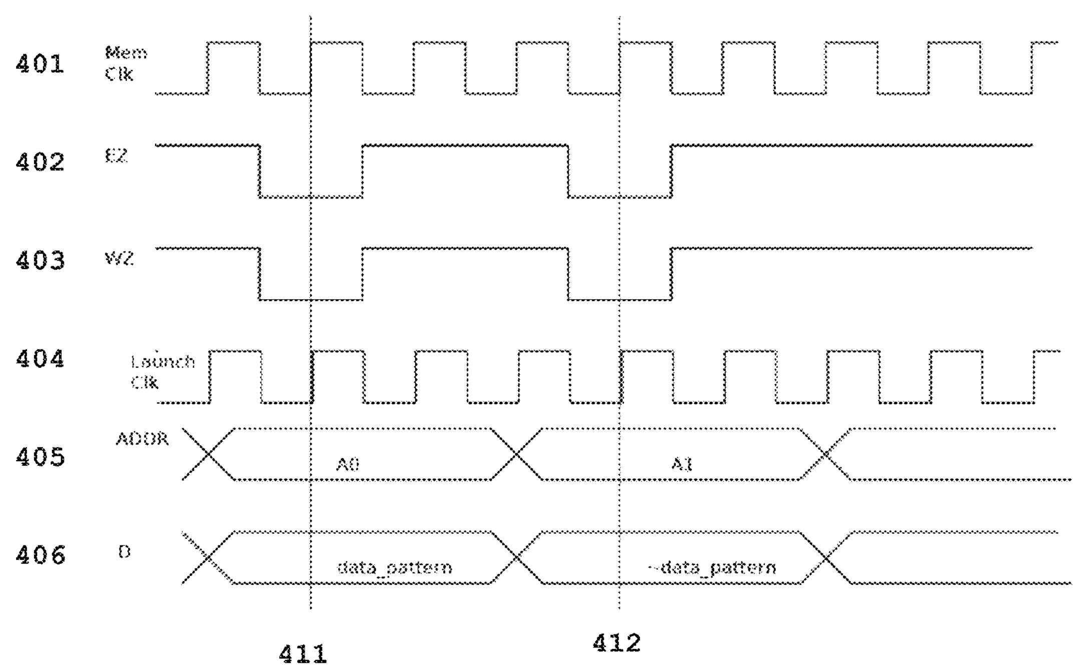
FIG. 4 illustrates signals of an example of this invention regarding set up for the read mode determination.
Figure 5:
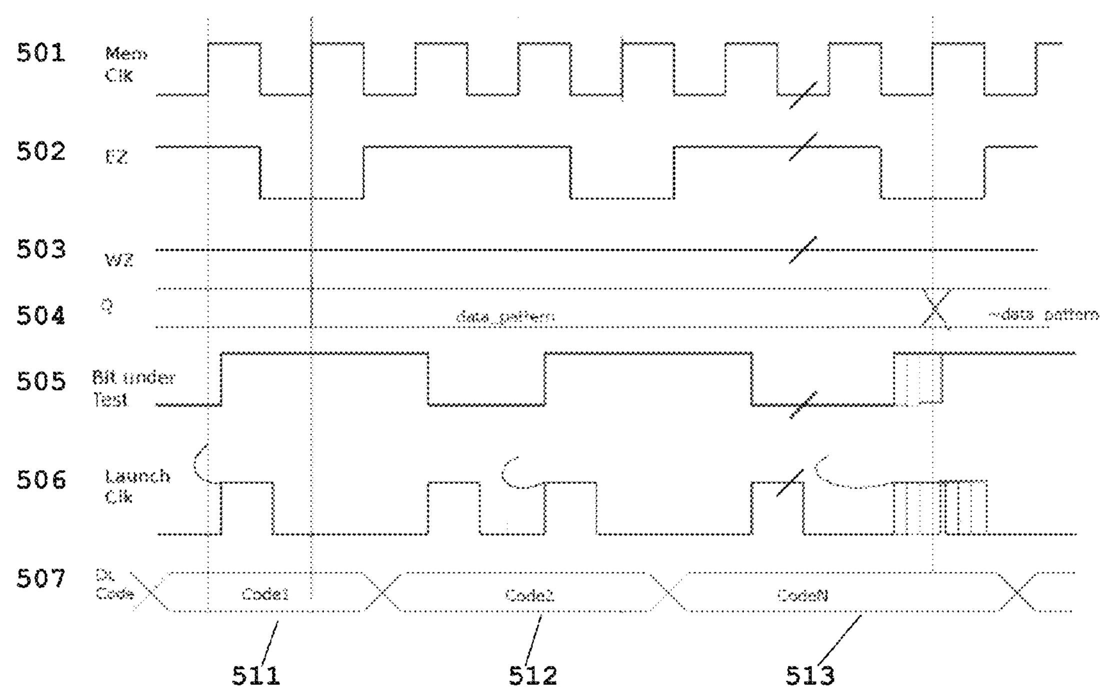
FIG. 5 illustrates example signals of the read mode determination of this invention.

FIG. 4 illustrates signals of this invention regarding set up for the read mode determination. As noted above the read mode requires writing data_pattern and ~(data_pattern) at consecutive addresses. At time 411 on the leading edge of memory clk 401 and launch clk 404, with EZ 402 indicating memory enable and WZ 403 indicating write, address 405 from address bit hold register 211 is the address to be tested A0 and data 406 from data hold register 213 is data_pattern. During a later cycle under similar conditions at time FIG. 5 illustrates example signals of the read mode determination. FIG. 5 illustrates memory clk 501, EZ 502 periodically enabled, WZ 503 constantly in the read mode, output Q 504. Bit under test 505 is periodically changed under synchronism with launch clk 506. Each launch occurs under different delay code 507 such as code1 511, code2 512 to codeN 513.

In write mode, the memory can be tested on both address and data pins. The test is applied to only one pin at a time. Thus the write test is split further into testing data and testing address. The basic algorithm is as follows:

1. Initialize the address locations to all zeros, with delay_code=0.

2. Write to the address location using the current delay_code.

3. Test if write was successful by reading from the address location and comparing with input value.

4. Repeat from step 1, in this example 8 times.

5. Increment delay_code to the next value.

6. Repeat from step 1, till delay_code reaches max code. Based on setup_pass/hold_pass, the corresponding delay codes are stored in separate registers.

Figure 6A:
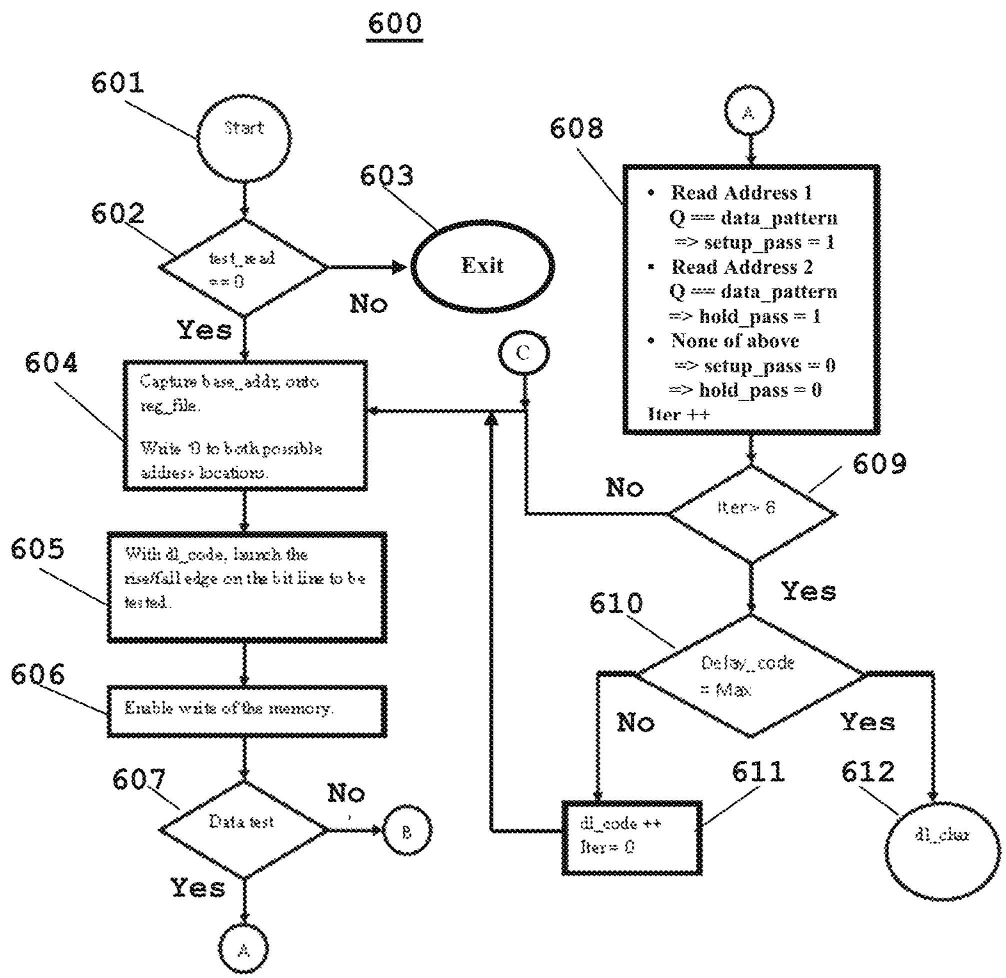
FIGS. 6A and 6B together illustrate the basic algorithm for write mode characterization of one embodiment of this invention.
Figure 6B:
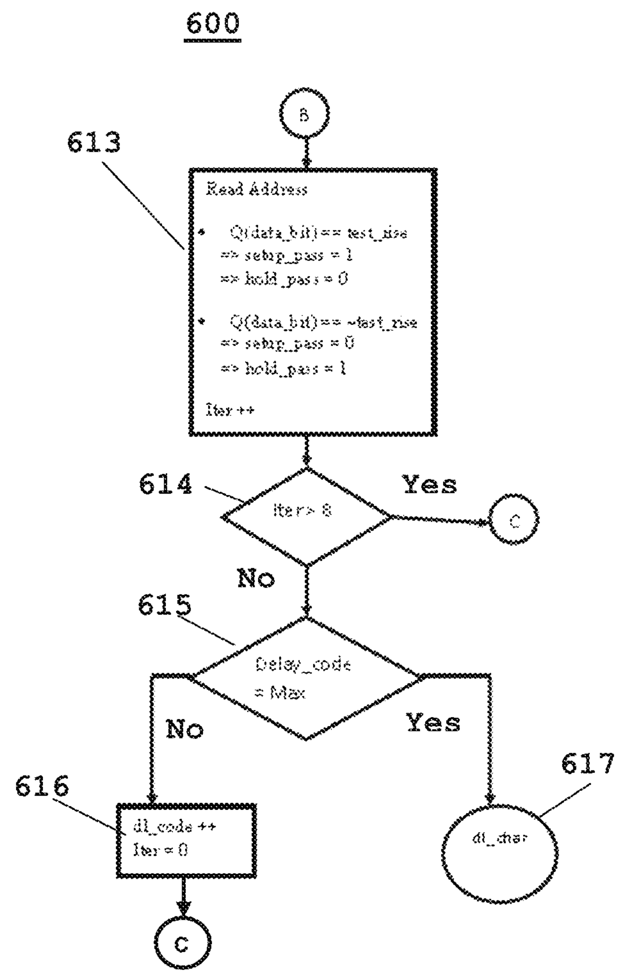

FIGS. 6A and 6B together illustrate the basic algorithm 600 for write mode characterization. Algorithm 600 begins with start block 601. Test block 602 determines if the test_read is inactive (test_read==0). If not (No at test block 602), then algorithm 600 is inapplicable and ends at exit block 603. If true (Yes at test block 602), then algorithm 600 proceeds with block 604. Block 604 initializes the address locations to all zeros, with delay_code=0; writes to the next address location with delay_code=0. Block 604 captures the data pattern at the base address onto the register file. Block 604 writes 0 to both address locations.

Block 605 launches a rise/fall edge on the bit line to be tested with the current delay code. Block 606 enables a memory write for one cycle.

Test block 607 determines whether the current test is a data test. If the current test is a data test (Yes at test block 607), then program flow proceeds to block 608.

Block 608 sets some parameters. If Read Address 1 Q==data_pattern, then block 608 sets setup_pass=1. This indicates that setup is passing. If Read Address 2 Q==data_pattern then block 608 sets hold_pass=1. This indicates that hold is passing. If Q is neither of those, then block 608 sets setup_pass=0 and hold_pass=0. This indicates that neither setup nor hold is passing. Block 608 increments a loop variable iter (iter++).

Test block 609 determines if the loop variable iter is greater than 8. FIG. 6 illustrates an example that takes 8 measurements for each step of delay_code. This is merely an example, the number of iterations could be less than or more than 8. If iter is not greater than 8 (No at test block 609), then program flow proceeds to block 604 for another iteration. If iter is greater than 8 (Yes at test block 609), then repeat testing for the current value of delay_count is complete. Program flow proceeds to test block 610.

Test block 610 determines whether delay_code is the maximum delay_code. If delay_code does not equal the maximum delay_code (No at test block 610), then further delay_code steps are needed. Program flow proceeds to block 611. Block 611 increments delay_code (delay_code++) and resets the iteration variable iter (iter=0). Program flow returns to block 604 for reinitialization for testing at the next delay_code value (block 612). If delay_code does equal the maximum delay_code (Yes at test block 610), then no further delay_code steps are needed. Program flow proceeds to block 613 which captures the results (delay_char). This involves the stepup_pass and hold_pass variables set in block 608.

If the current test is not a data test (No at test block 607), this in an address test and then program flow proceeds to block 613. Block 613 sets some parameters. Block 613 reads data at the address. If Q(data_bit)==test_rise, then block 613 sets setup_pass=1 and hold_pass=0. This indicates that setup is passing. If Q(data_bit)==~test_rise then block 613 sets setup_pass=0 and hold_pass=1. This indicates that hold is passing. Block 613 increments a loop variable iter (iter++).

Test block 614 determines if the loop variable iter is greater than 8. FIG. 6 illustrates an example that takes 8 measurements for each step of delay_code. This is merely an example, the number of iterations could be less than or more than 8. If iter is not greater than 8 (No at test block 614), then program flow proceeds to block 604 for another iteration. If iter is greater than 8 (Yes at test block 614), then repeat testing for the current value of delay_count is complete. Program flow proceeds to test block 615.

Test block 615 determines whether delay_code is the maximum delay_code. If delay_code does not equal the maximum delay_code (No at test block 615), then further delay_code steps are needed. Program flow proceeds to block 616. Block 616 increments delay_code (delay_code++) and resets the iteration variable iter (iter=0). Program flow returns to block 604 for testing at the next delay_code value. If delay_code does equal the maximum delay_code (Yes at test block 615), then no further delay_code steps are needed. Program flow proceeds to block 618 which captures the results (delay_char). This involves the stepup_pass and hold_pass variables set in block 613.

Figure 7:
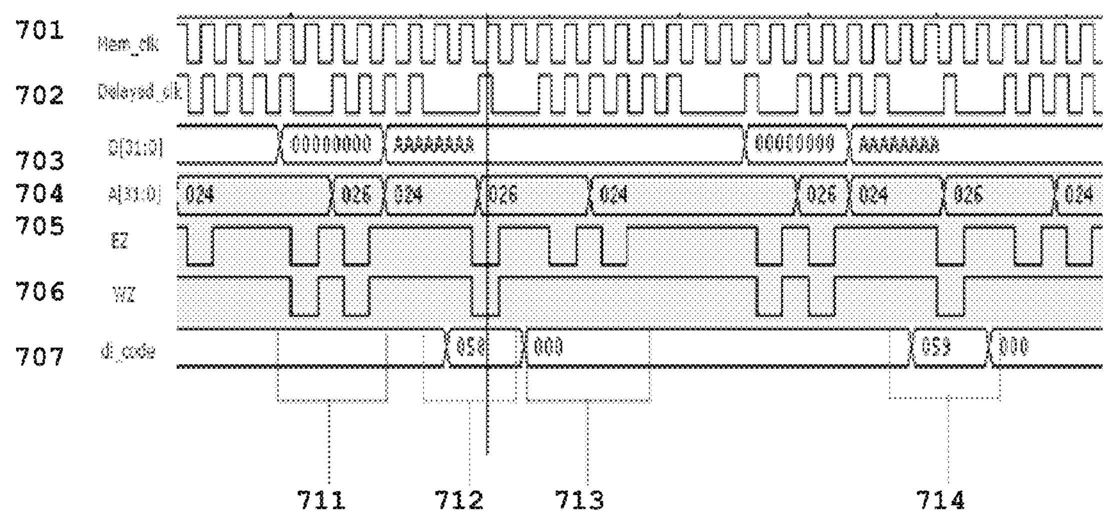
FIG. 7 illustrates example signals of this invention regarding set up for the write mode determination.

FIG. 7 illustrates signals of this invention regarding set up for the write mode determination. FIG. 7 illustrates memory_clk 701, delayed_clk 702, an indication to data[31:0} 703, an indication of address[31:0] 704 which toggles between differing address bits 024(hex) and 026(hex), EZ 705 periodically enabling the memory under test, WZ 706 periodically enabling memory writes and delay_code 707.

FIG. 7 illustrates the following operations. During time interval 711, the test system writes all 0's into the two possible address locations. During time interval 712, the test system changes the delay_code, launches the address or data bit under test and performs the test write. The example of FIG. 7 illustrates this occurs with a delay_code of 058. During time interval 713, the test system determines what data was written into which address location. The test system also determines during time interval 713 if the setup or hold window passes. The example illustrated in FIG. 7 does not illustrate repeating this measurement, but in general this could be repeated here. During interval 714, the test system increments the delay_code (in this example to delay_code 059) to perform the test with the next delay.

In order to measure clock to Q delay, a delay line is introduced on the clock path of the memory. This facilitates the skewing of the memory launch with respect to the capture flops at the Q output of the memory. By knowing the point at which the capture fails, we can compute the clock to Q delay similar to the setup and hold characterization. For clock to Q characterization second delay line 217 to produce no delay.

Figure 8:
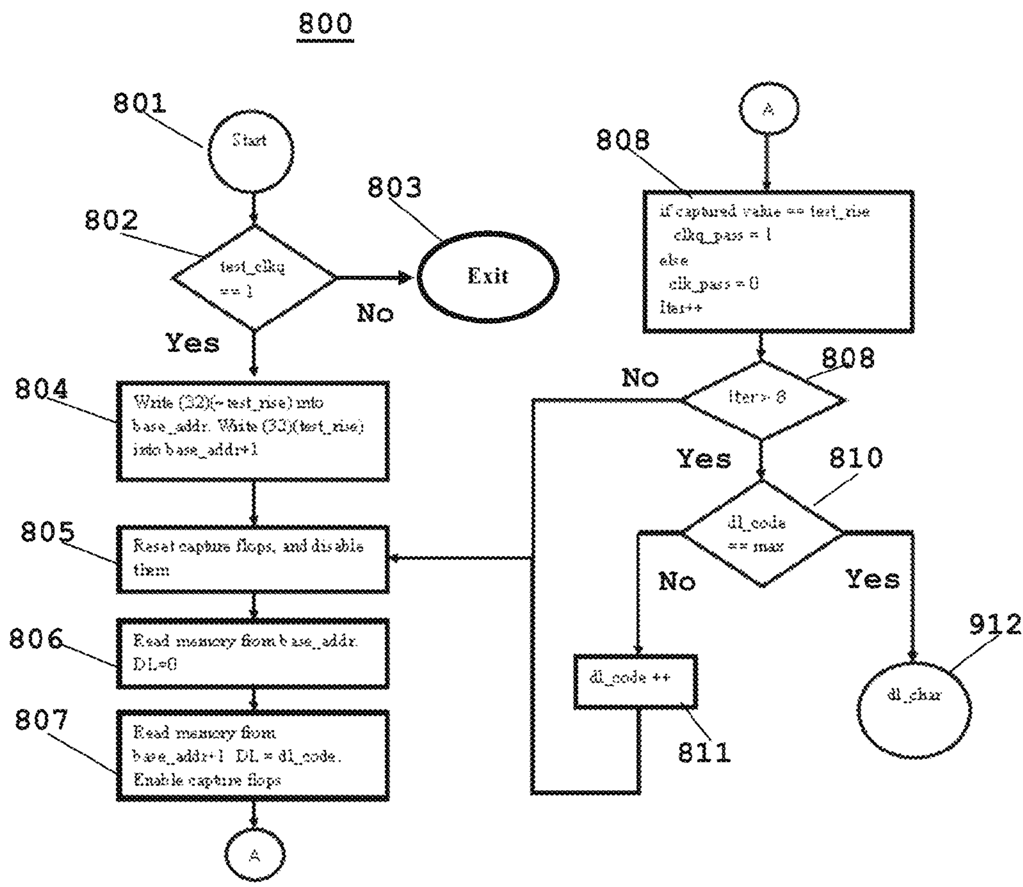
FIG. 8 illustrates the basic algorithm 800 for clock to Q characterization of one embodiment of this invention.

FIG. 8 illustrates the basic algorithm 800 for clock to Q characterization. Algorithm 800 begins with start block 801. Test block 802 determines if the test_clkq is active (test_clkq=1). If not (No at test block 802), then algorithm 800 is inapplicable and ends at exit block 803. If true (Yes at test block 802), then algorithm 800 proceeds with block 804. Block 804 writes thirty-two times~(test_rise) into the base address (base_addr) and writes thirty-two times test_rise into the next address following the base address (base_addr+1). Block 805 resets and disables the capture flip-flops.

Block 806 reads from the memory at the base address (base_addr) and the current delay_code. Block 807 reads from the memory at the next address following the base address (base_addr+1) and the current delay_code. Block 807 enables the capture flip-flops.

Block 808 sets some parameters. If the captured value==test_rise, then block 809 sets clkq_pass=1. If the captured value is anything else, then block 309 sets clkq_pass=0. Block 808 increments a loop variable iter (iter++).

Test block 809 determines if the loop variable iter is greater than 8. FIG. 8 illustrates an example that takes 8 measurements for each step of delay_code. This is merely an example, the number of iterations could be less than or more than 8. If iter is not greater than 8 (No at test block 809), then program flow proceeds to block 805 for another iteration. If iter is greater than 8 (Yes at test block 809), then repeat testing for the current value of delay_code is complete. Program flow proceeds to test block 810.

Test block 810 determines whether delay_code is the maximum delay_code. If delay_code does not equal the maximum delay_code (No at test block 810), then further delay_code steps are needed. Program flow proceeds to block 811. Block 811 increments delay_code (delay_code++). Block 811 resets the iteration variable iter (iter=0). Program flow returns to block 805 for testing at the next delay_code value. If delay_code does equal the maximum delay_code (Yes at test block 810), then no further delay_code steps are needed. Program flow proceeds to block 812 which captures the results (delay_char). This involves the clkq_pass variable set in block 808.

Figure 9:
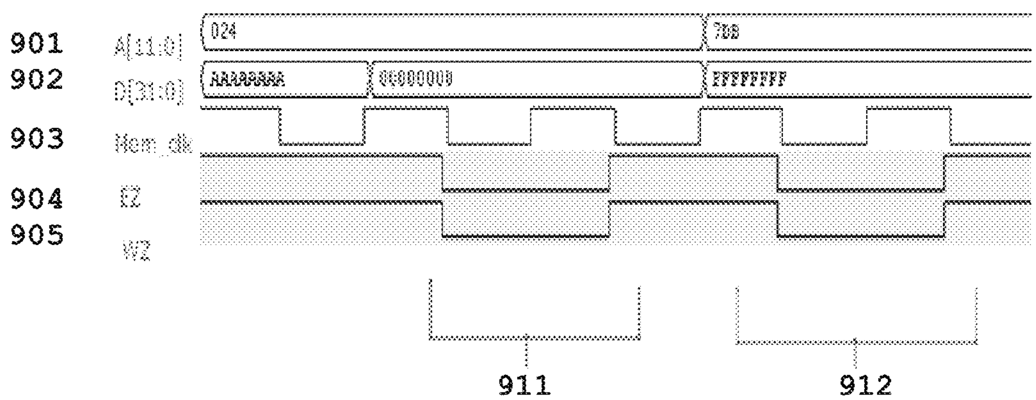
FIG. 9 illustrates example signals of this invention regarding set up for the clock to Q determination of this invention.

FIG. 9 illustrates signals of this invention regarding set up for the clock to Q determination. FIG. 9 illustrates address [11:0] 901 which in this example toggles between 024(hex) and 7DB(hex), data[31:0] which in this example switch between all 0's and all 1's, memory_clk 903, EZ 904 periodically enabling the memory under test and WZ 905 periodically enabling memory writes. During interval 911, the test system writes all 0's in the first memory address 024(hex). During the interval 912, the test system writes all 1's in the second memory address 7DB(hex).

Figure 10:
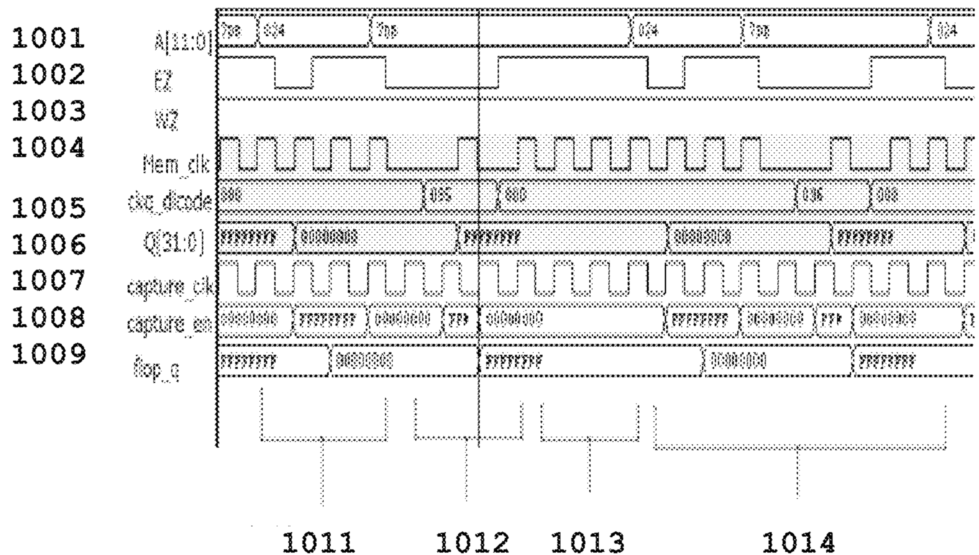
FIG. 10 illustrates example signals of the clock to Q determination of this invention.

FIG. 10 illustrates example signals of the clock to Q determination. FIG. 10 illustrates address[11:0] 1001 which in this example toggles between 024(hex) and 7DB(hex), EZ 1002 periodically enabling the memory under test, WZ 1003 always in the read mode, memory_clk 1004, ckq_dlcode 1005, the output Q[31:0] 1006, capture_clk 1007, capture_en 1008 and flop_q 1009 which toggles between all 1's and all 0's. During time interval 1011, the test system initializes the memory under test, the Q bits and all capture flop bits to the first address. During time interval 1012, the test system puts the second address into the address flops, enables memory read, selects the delayed clock for memory under test 220, enables the capture flops an captures the output Q[31:0]. During time interval 1013, the test system checks to see if the second address is capture and if not flags this as a failure. During time interval 1014, the test system increases the delay_code for the next test.

The delay line will be characterized at two points, once at the code where setup passes and once at the code at which hold passes. By characterizing the specific delay line instance, the effects of on chip variations (OCV) is reduced.

Figure 11:
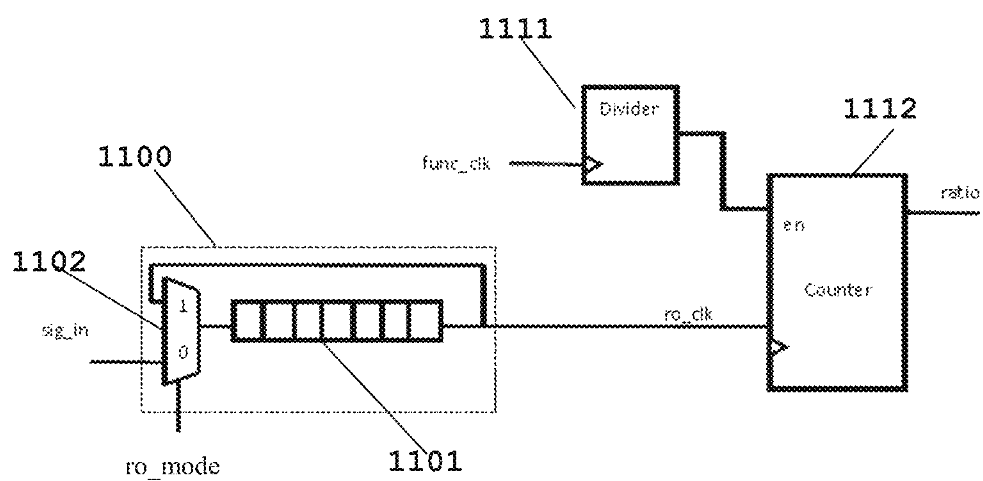
FIG. 11 illustrates a configuration of a delay line of one embodiment of this invention permitting ring oscillator connection for characterization based on ring oscillator frequency.

FIG. 11 illustrates a configuration of a delay line permitting ring oscillator connection for characterization based on ring oscillator frequency. The delay line is put into the ring oscillator mode as illustrated in FIG. 11. Delay line 1100 includes a chain of delay elements 1101 and a multiplexer 1102. A ring oscillator (ro) signal controls the selection of multiplexer 1102. When ro==1, multiplexer 1102 selects the SIG_IN signal for application the input of the chain of delay elements 1101. Delay line 1100 is in a normal mode. When ro==0, multiplexer 1102 selects the output of the last delay element in the chain of delay elements 1101 for application the input of the chain of delay elements 1101. Delay line 1100 is in a ring oscillator mode. In the ring oscillator mode, the chain of delay elements 1101 oscillates at a frequency determined by the total delay of the chain of delay elements 1101. Upon characterization of delay line 1100 the frequency of the output ro_clk is measured using divider 1111 and counter 1112. Divider 1111 divides an input control frequency func_clk and controls counter 1112 via an enable input. Counter 1112 outputs a signal ratio proportional to the ratio of func_ckl and ro_clk. The ro_clk frequency is computed as follows:

$$T_{RO} = 2 * (\text{Delay from } DL)$$

$$T_{En} = 0.5 * (2^{13}) * T_{func\_ok}$$

$$T_{En} = \text{count} * T_{RO}$$

$$(2^{12}) * T_{func\_clk} = \text{count} * T_{RO}$$

-continued $$T_{RO} = \frac{(2^{12}) * T_{func\_clk}}{\text{count}}$$

$$T_{Setup} = T_{func\_clk} - T_{DL}$$

$$T_{Setup} = T_{func\_clk} - \frac{(2^{11}) * T_{func\_clk}}{\text{count}}$$

$$T_{Setup} = T_{func\_clk} * \left(\frac{\text{count} - (2^{11})}{\text{count}}\right)$$

$$T_{Hold} = T_{DL} - T_{func\_clk}$$

$$T_{Hold} = \frac{(2^{11}) * T_{func\_clk}}{\text{count}} - T_{func\_clk}$$

$$T_{Hold} = T_{func\_clk} * \left(\frac{(2^{11}) - \text{count}}{\text{count}}\right)$$

Divider 1111 is preferably the most significant bits (MSB) of a 13 bit counter.

Figure 12:
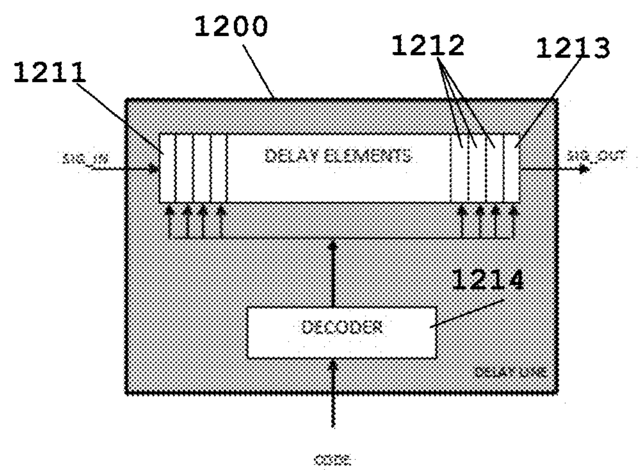
FIG. 12 illustrates a block diagram of a programmable delay line suitable for use in this invention.

FIG. 12 illustrates a block diagram of a programmable delay line suitable for use as first programmable delay line 215 and second programmable delay line 217. Programmable delay line 1200 includes initial delay element 1211, plural chained intermediate delay elements 1212 to last delay element 1213 driven by decoder 1214. Programmable delay line 1200 has a delay range of more than 1 clock cycle. This is necessary to cover setup and hold window of the memory. Programmable delay line 1200 delays the input SIG_IN linear to the programmed value of the delay code. Decoder 1214 receives a code from and external source. Decoder 1214 generates signals to delay elements 1211, 1212 and 1213 to select a number of delay elements corresponding to the received code.

Figure 13:
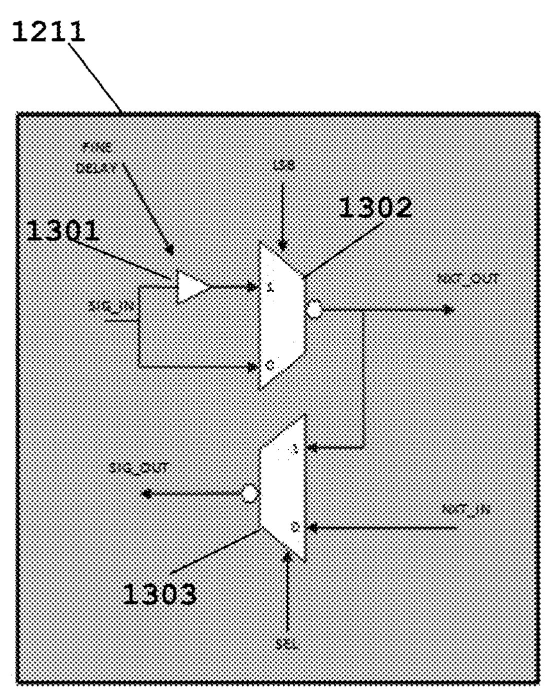
FIG. 13 illustrates a circuit diagram of initial delay element of the programmable delay line illustrated in FIG. 12.

FIG. 13 illustrates a circuit diagram of initial delay element 1211. Initial delay element 1211 is the first delay element in the delay line. This is implemented using 2 instances of same inverting multiplexer and one buffer. All these circuits are preferably implemented as standard cells. Initial delay element 1211 includes buffer 1301 and inverting multiplexers 1302 and 1303. SIG_IN is supplied to the input of buffer 1301 and to the 0 input of inverting multiplexer 1302. The output of buffer 1301 supplies the 1 input of inverting multiplexer 1302. The signal selection of inverting multiplexer 1302 is controlled by the least significant bit (LSB) of the delay code. The output of inverting multiplexer 1302 supplies a NXT_OUT signal supplied to the next delay element 1212 and the 1 input of inverting multiplexer 1303. A NXT_IN signal from the next delay element 1212 supplies the 0 input of inverting multiplexer 1303. The output of inverting multiplexer 1303 supplies SIG_OUT, the output of programmable delay line 1200. The signal selection of inverting multiplexer 1303 is controlled by a SEL signal from decoder 1214.

Buffer 1301 preferably has a delay matching the delay of inverting multiplexers 1302 and 1303. The LSB of the delay code determines whether a fine delay of buffer 1301 is selected. This LSB of the delay code will not be connected to the decoder. If LSB is 1, buffer 1301 and its delay are selected at inverting multiplexer 1302. If LSB is 0, buffer 1301 and its delay are not selected at inverting multiplexer 1302. If the SEL signal to initial delay element 1211 is 1, inverting multiplexer 1303 selects the output of inverting multiplexer 1302 forming a minimal delay of 2 times the inverting multiplexer delay or 2 times the inverting multiplexer delay plus the buffer delay depending on the state of LSB. If the SEL signal to initial delay element 1211 is 0, inverting multiplexer 1303 selects the NXT_IN signal from the next delay element. The total delay depends upon the selected length of the chain.

Figure 14:
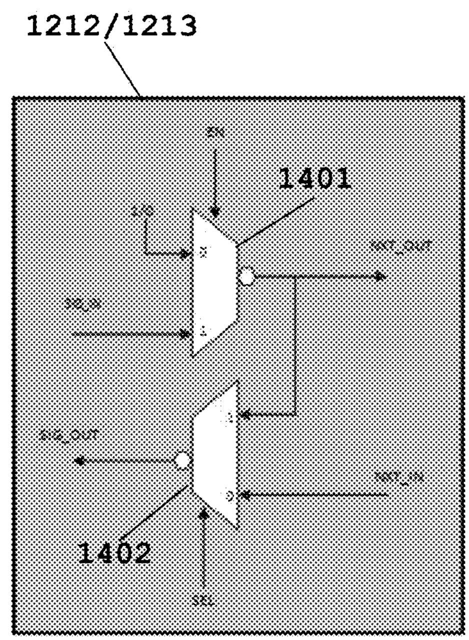
FIG. 14 illustrates a circuit diagram of intermediate delay element and final delay element of the programmable delay line illustrated in FIG. 12.

FIG. 14 illustrates a circuit diagram of intermediate delay element 1212 and final delay element 1213. These delay elements are similar to initial delay element 1211 without a buffer 1301 for fine delay. Delay elements 1212 and 1213 are subsequent delay elements in the delay line chain. These delay elements are implemented using 2 instances of same inverting multiplexer. These inverting multiplexers are preferably implemented as standard cells. Delay elements 1212 and 1213 include inverting multiplexers 1401 and 1402. SIG_IN from the NXT_OUT of the prior delay element is supplied to the 1 input of inverting multiplexer 1401. A signal of 1 or 0 supplies the 0 input of inverting multiplexer 1401 in a manner further described below. The signal selection of inverting multiplexer 1401 is controlled by a corresponding enable (EN) signal from decoder 1214. The output of inverting multiplexer 1401 supplies a NXT_OUT signal supplied to a next delay element and the 1 input of inverting multiplexer 1402. A NXT_IN signal from the next delay element supplies the 0 input of inverting multiplexer 1402. The output of inverting multiplexer 1402 supplies SIG_OUT to a previous delay element of programmable delay line 1200. The signal selection of inverting multiplexer 1402 is controlled by a corresponding SEL signal from decoder 1214.

The EN input determines whether the SIG_IN propagates to next element (NXT_OUT) or not. When EN is set to 0, this will switch off the input to further section of the delay line to save power. The 0 input of inverting multiplexer 1401 controlled by EN will be tied to '1' and '0' at alternate stages. For example, if the second delay element is tied to 1, then the third delay element will be tied to 0 and the fourth delay element will be tied 1 and so on. This provides for a robust way of changing code to the delay line on the fly. The delay code is preferably updated during the low period of SIG_IN. During the low period of SIG_IN, inputs to all the multiplexers will be at the same logic level. The change in the delay code causing a change in turn EN and SEL will not cause a glitch in the output and hence the output is clean. If the SEL signal to delay element 1212/1213 is 1, inverting multiplexer 1303 selects the output of inverting multiplexer 1402 selects the output of inverting multiplexer 1401. If the SEL signal to delay element 1212/1213 is 0, inverting multiplexer 1303 selects the NXT_IN signal from the next delay element. The total delay depends upon the selected length of the chain.

Figure 15:
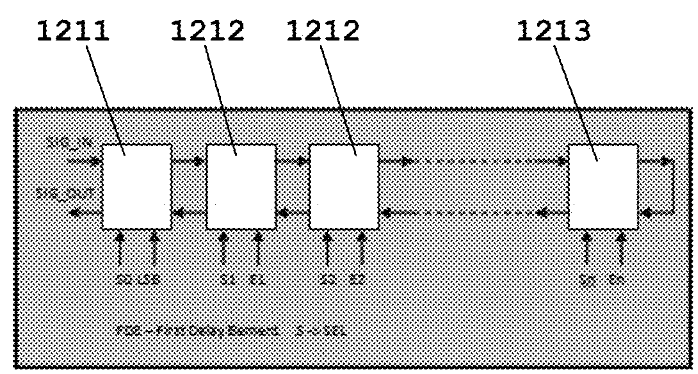
FIG. 15 illustrates the delay element chain of the programmable delay line illustrated in FIG. 12.

FIG. 15 illustrates the delay element chain of the programmable delay line. Delay elements are serially connected from initial delay element 1211, thorough at least one intermediate delay element 1212 to last delay element 1213. Each delay element 1211, 1212 and 1213 receives four inputs: SIG_IN, SELx, ENx and NXT_IN. Each delay element 1211, 1212 and 1213 produces two outputs: SIG_OUT and NXT_OUT. The system input SIG_IN supplies the SIG_IN input of initial delay element 1211. The SIG_OUT of initial delay element 1211 supplies the system SIG_OUT output. As previously described, the LSB of the delay code supplies the EN input of initial delay element 1211. The NXT_OUT output of initial delay element 1211 supplies the SIG_IN of the next intermediate delay element 1212. The SIG_OUT of the next intermediate delay element 1212 supplies the NXT_IN input of initial delay element 1211. Each intermediate delay element 1212 is coupled similarly. The NXT_OUT output of an intermediate delay element 1212 supplies the SIG_IN of the next intermediate delay element 1212. The SIG_OUT of the next intermediate delay element 1212 supplies the NXT_IN input of each delay element 1212. Final delay element 1213 is connected similarly to intermediate delay elements 1212 except that the NXT_OUT output of the last delay element 1213 supplies its NXT_IN input.

Decoder 1214 receives a delay code and encodes signals to initial delay element 1211, intermediate delay elements 1212 and final delay element 1214 to set a corresponding delay. Enabling and connecting more delay elements causes a longer delay. Table 1 shows the coding for an example delay line 1200 having 4 stages controlled by a three-bit delay code.

TABLE 1

| DELAY CODE[2:0] | LSB | SEL[0:3] | EN[0:3] | Number Of Delays |
|---|---|---|---|---|
| 000 | 0 | 1000 | 1000 | 2 |
| 001 | 1 | 1000 | 1000 | 3 |
| 010 | 0 | 0100 | 1100 | 4 |
| 011 | 1 | 0100 | 1100 | 5 |
| 100 | 0 | 0010 | 1110 | 6 |
| 101 | 1 | 0010 | 1110 | 7 |
| 110 | 0 | 0001 | 1111 | 8 |
| 111 | 1 | 0001 | 1111 | 9 |

The eight combinations of the three-bit delay code select between 2 and 9 delays. Each delay is the delay of a buffer or of a inverting multiplexer.

What is claimed is:

1. A memory characterization circuit comprising:

a first programmable delay line having an input receiving a system clock signal and an output;

a second programmable delay line having an input connected to said output of said first programmable delay line and an output;

an address register having a plurality of address memory elements for storing an address, each address memory element having an input receiving a corresponding address input bit, an output supplying a stored address bit and a clock input connected to said output of said second programmable delay line, each address memory element storing an address bit corresponding to said address input bit upon a predetermined edge of said output of said second programmable delay line at said clock input, said output of each address memory element connected to a corresponding address bit input of a memory to be tested;

a data register having a plurality of data memory elements for storing data, each data memory element having an input receiving a corresponding data input bit, an output supplying a stored data bit and a clock input connected to said output of said second programmable delay line, each data memory element storing a data bit corresponding to said data input bit upon a predetermined edge of said output of said second programmable delay line at said clock input, said output of each data memory element connected to a corresponding data bit input of a memory to be tested;

an output register having a plurality of output memory elements for storing data, each output memory element having an input receiving a corresponding data output bit of the memory to be tested, an output supplying a stored data bit and a clock input receiving said system clock signal, each output memory element storing a data bit corresponding to said data output bit of the memory to be tested upon a predetermined edge of the system clock signal at said clock input, said output of each output memory element connected to a corresponding data bit input of a memory to be tested;

a finite state machine controller supplying an address to said address register, data to said data register and controlling a delay of said first programmable delay line and said second programmable delay line in at least one predetermined sequence to determine an operating characteristic of the memory to be tested.

2. The memory characterization circuit of claim 1, wherein:

said finite state machine has a clock input receiving said system clock signal.

3. The memory characterization circuit of claim 1, wherein:

said finite state machine has a data input connected to said output of said output register.

4. The memory characterization circuit of claim 1, wherein:

said finite state machine has a first data input connected to said output of said output register and a second data input connected to the output of the memory to be tested.

5. The memory characterization circuit of claim 1, further comprising:

a ring oscillator multiplexer having a first input connected to said input of said first programmable delay line, a second input connected to said output of said first programmable delay line and a control input, said ring oscillator selecting said input of said first programmable delay line for normal operation upon a first digital state of a signal at said control input and selecting said output of said first programmable delay line for ring oscillator operation upon a second digital state opposite said first digital state of a signal at said control input;

a counter having a count input connected to said output of said first programmable delay line, an enable input and a count output, said counter counting pulses at said count input when enabled to thereby produce a count indicative of a delay of said first delay line.

6. The memory characterization circuit of claim 1, wherein:

said first programmable delay line, said second programmable delay line, said address register, said data register, said output register, said finite state machine controller and said memory to be tested are constructed on a same semiconductor substrate.

7. The memory characterization circuit of claim 1, wherein:

each of said first programmable delay line and said second programmable delay line comprises:

a serial chain of a plurality of delay elements, each delay element having a signal input, a signal output, a next input and a next output, said signal input of a first delay element in said serial chain receiving the corresponding programmable delay element input, said signal input of subsequent delay elements in the serial chain connected to said next output of a prior delay element in said serial chain, said next output connected to said next input of a next delay element in said serial chain, said next input connected to said signal output of a next delay element in said serial chain, and a decoder having an receiving a delay code corresponding to said programmable delay and outputs connected to each delay element, said decoder activating a number of said delay elements corresponding to said delay code.

8. The memory characterization circuit of claim 7, wherein:

said first delay element comprises:

a buffer having a input connected to said signal input of said first delay element and an output, a first inverting multiplexer having a first input connected to said output of said buffer, a second input connected to said input of said first delay element, a control input connected to said decoder and said next output, said next output being said first input or said second input dependent upon said control input, and a second inverting multiplexer having a first input connected to said output of said first inverting multiplexer, a second input connected to said signal output of a next delay element in said serial chain, a control input connected to said decoder and a signal output, said signal output being said first input or said second input dependent upon said control input.

9. The memory characterization circuit of claim 8, wherein:

said buffer, said first inverting multiplexer and said second inverting multiplexer are constructed of standard cells having an identical input to output delay.

10. The memory characterization circuit of claim 7, wherein:

said plurality of element elements includes at least one intermediate delay element comprising:

a first inverting multiplexer having a first input connected to a constant input, a second input connected to a next output of a prior delay element in the serial chain, a control input connected to said decoder and a next output, said next output being said first input or said second input dependent upon said control input, and a second inverting multiplexer having a first input connected to said output of said first inverting multiplexer, a second input connected to a next input of said first delay element, a control input connected to said decoder and a signal output, said signal output being said first input or said second input dependent upon said control input.

11. The memory characterization circuit of claim 10, wherein:

said first inverting multiplexer and said second inverting multiplexer are constructed of standard cells having an identical input to output delay.

12. The memory characterization circuit of claim 7, wherein:

said plurality of element elements includes a final delay element comprising:

a first inverting multiplexer having a first input connected to a constant input, a second input connected to a next output of a prior delay element in the serial chain, a control input connected to said decoder and a next output, said next output being said first input or said second input dependent upon said control input, and a second inverting multiplexer having a first input connected to said output of said first inverting multiplexer, a second input connected to said output of said first inverting multiplexer, a control input connected to said decoder and a signal output, said signal output being said first input or said second input dependent upon said control input.

13. The memory characterization circuit of claim 12, wherein:

said first inverting multiplexer and said second inverting multiplexer are constructed of standard cells having an identical input to output delay.

14. The memory characterization circuit of claim 1, wherein:

said finite state machine controller is operable to characterize a read mode of the memory to be tested by storing a predetermined data pattern in the memory to be tested at a first address, storing an inverse of the predetermined data pattern in the memory to be tested at a second address having one bit differing from said first address, for each of a plurality of delay values reading the memory to be tested at said first address delayed in said second delay line by a current delay value, capturing a read output of the memory to be tested, and determining whether the read output is said predetermined data pattern or said inverse of said predetermined data pattern.

15. The memory characterization circuit of claim 14, wherein:

said finite state machine controller repeats said steps of reading, capturing and determining plural times for each of said plurality of delay values.

16. The memory characterization circuit of claim 1, wherein:

said finite state machine controller is operable to characterize a write mode of the memory to be tested by for each of a plurality of delay values storing all 0's in all memory locations of the memory to be tested, storing a predetermined data pattern at a predetermined address in the memory to be tested, reading from the memory to be tested at the predetermined address, and determining whether the read output is said predetermined data pattern.

17. The memory characterization circuit of claim 15, wherein:

said finite state machine controller repeats said steps of storing, storing, reading and determining plural times for each of said plurality of delay values.

18. The memory characterization circuit of claim 1, wherein:

said finite state machine controller is operable to characterize a clock to output of the memory to be tested by storing a predetermined data pattern in the memory to be tested at a first address, storing said predetermined data pattern in the memory to be tested at a second address one more than said first address, for each of a plurality of delay values reading the memory to be tested at said first address delayed in said second delay line by a minimum delay value, reading the memory to be tested at said second address delayed in said second delay line by a current delay value, capturing a read output of the memory to be tested, and determining whether the read output is said predetermined data pattern.

19. The memory characterization circuit of claim 18, wherein:

said finite state machine controller repeats said steps of reading, reading, capturing and determining plural times for each of said plurality of delay values.

* * * * *